United States Patent
Chatterjee et al.

(10) Patent No.: US 6,579,798 B2
(45) Date of Patent: Jun. 17, 2003

(54) PROCESSES FOR CHEMICAL-MECHANICAL POLISHING OF A SEMICONDUCTOR WAFER

(75) Inventors: Basab Chatterjee, Allen, TX (US); Mona Eissa, Plano, TX (US); Chad Kaneshige, McKinney, TX (US); Vincent Korthuis, Plano, TX (US); Barry Lanier, Allen, TX (US); Satyavolu Papa Rao, Garland, TX (US)

(73) Assignee: Texas Instruments Incorporated, Dallas, TX (US)

( * ) Notice: Subject to any disclaimer, the term of this patent is extended or adjusted under 35 U.S.C. 154(b) by 22 days.

(21) Appl. No.: 09/960,349

(22) Filed: Sep. 24, 2001

(65) Prior Publication Data

US 2003/0060049 A1 Mar. 27, 2003

(51) Int. Cl.$^7$ .............................. H01L 21/302
(52) U.S. Cl. .................. 438/692; 438/693; 438/694; 438/749; 438/751; 438/754; 134/1.3; 216/88; 216/89; 216/90
(58) Field of Search ................. 438/692, 693, 438/694, 749, 751, 754; 216/89, 90, 88; 134/1.3

(56) References Cited

U.S. PATENT DOCUMENTS 6,458,674 B1 * 10/2002 Orashi et al. ............... 438/542
6,475,914 B2 * 11/2002 Han ............................ 438/687
2002/0068454 A1 * 6/2002 Sun et al. .................... 438/692

* cited by examiner

Primary Examiner—George Goudreau
(74) Attorney, Agent, or Firm—Jacqueline J. Garner; W. James Brady, III; Frederick J. Telecky, Jr.

(57) ABSTRACT

A process for polishing a semiconductor wafer includes the steps of providing a plurality of wafers, forming a first layer, such as a barrier layer, over at least a portion of each wafer, and forming at least one layer including copper over at least a portion of each first layer. The process also includes the steps of providing a first polishing pad, providing a buffing pad, providing a plurality of operatively connected wafer carriers, and disposing a wafer within each of the wafer carriers. The process further includes the steps of disposing a first slurry composition on the first polishing pad and polishing a first wafer with the first polishing pad for a first length of time, in which the first polishing pad substantially removes the copper layer of the first wafer. The process also includes the steps of simultaneously buffing a second wafer with the buffing pad for a second length of time, in which the first length of time is greater than the second length of time, and rinsing the buffing pad and the buffed wafer with a moisture maintenance compound for at least a portion of the time between the completion of the second length of time and the first length of time. Moreover, the moisture maintenance compound substantially prevents drying of the buffed wafer between the completion of the second length of time and the first length of time.

20 Claims, 10 Drawing Sheets

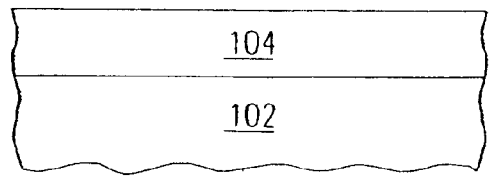
FIG. 1a(1)
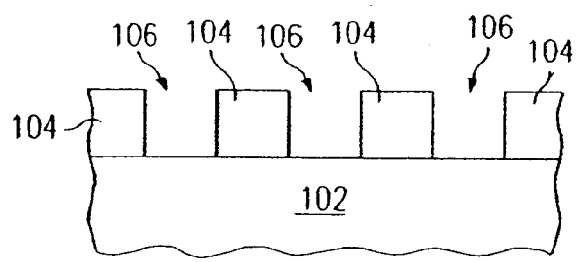
FIG. 1a(2)
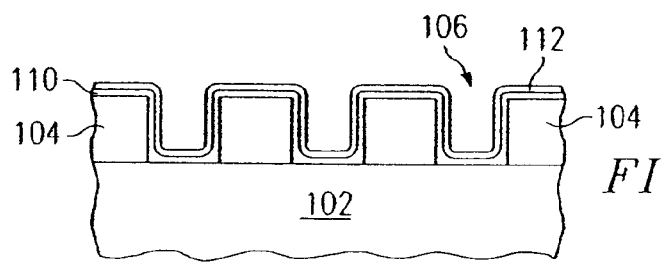
FIG. 1a(3)
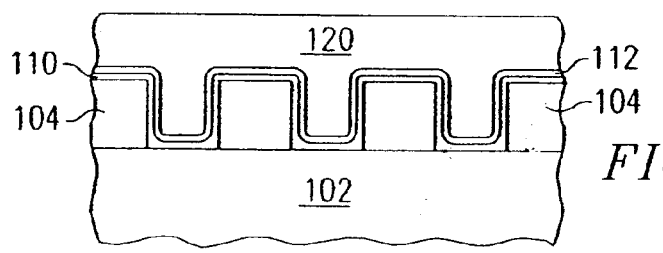
FIG. 1a(4)
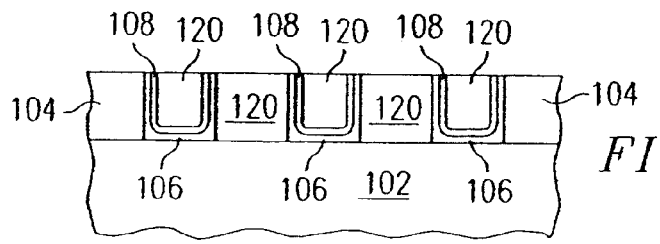
FIG. 1a(5)

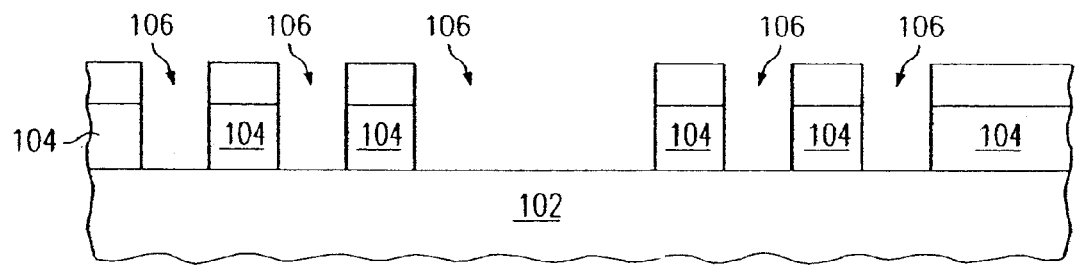
FIG. 1b(1)
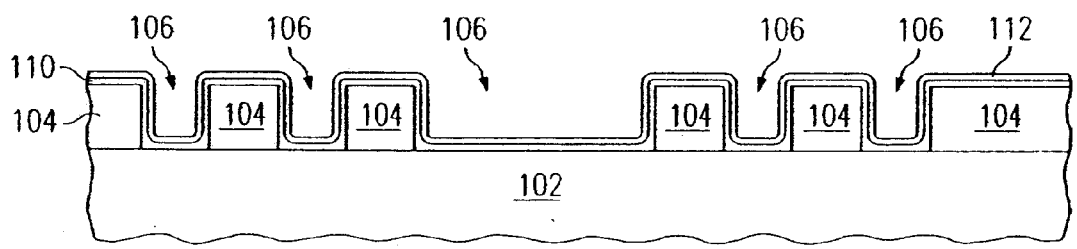
FIG. 1b(2)
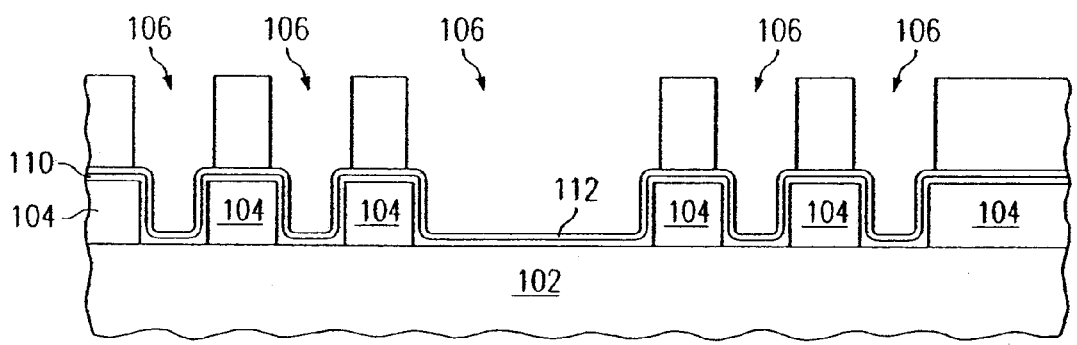
FIG. 1b(3)
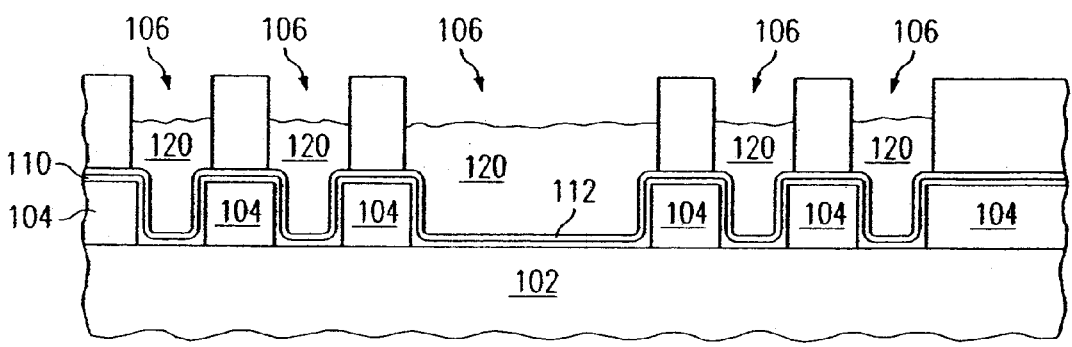
FIG. 1b(4)

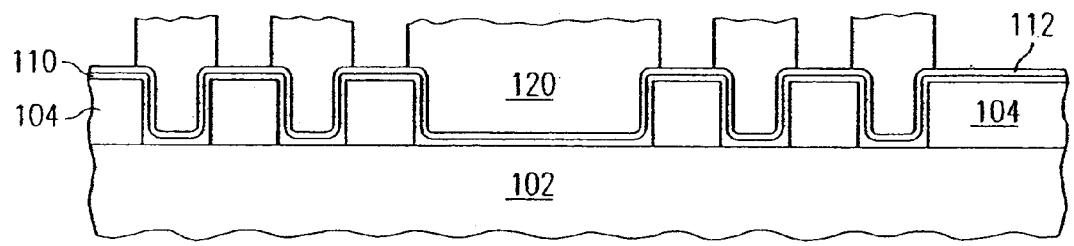
FIG. 1b(5)
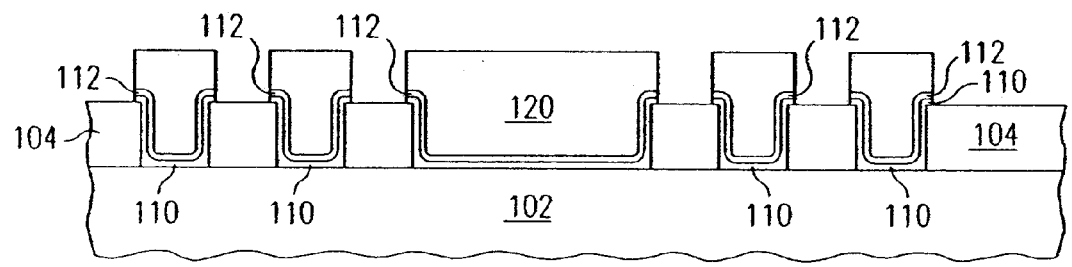
FIG. 1b(6)
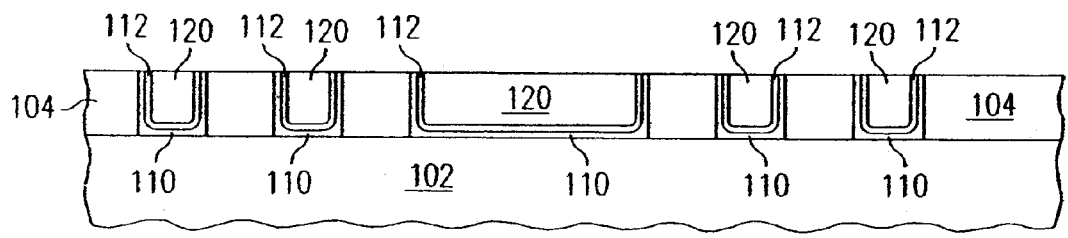
FIG. 1b(7)

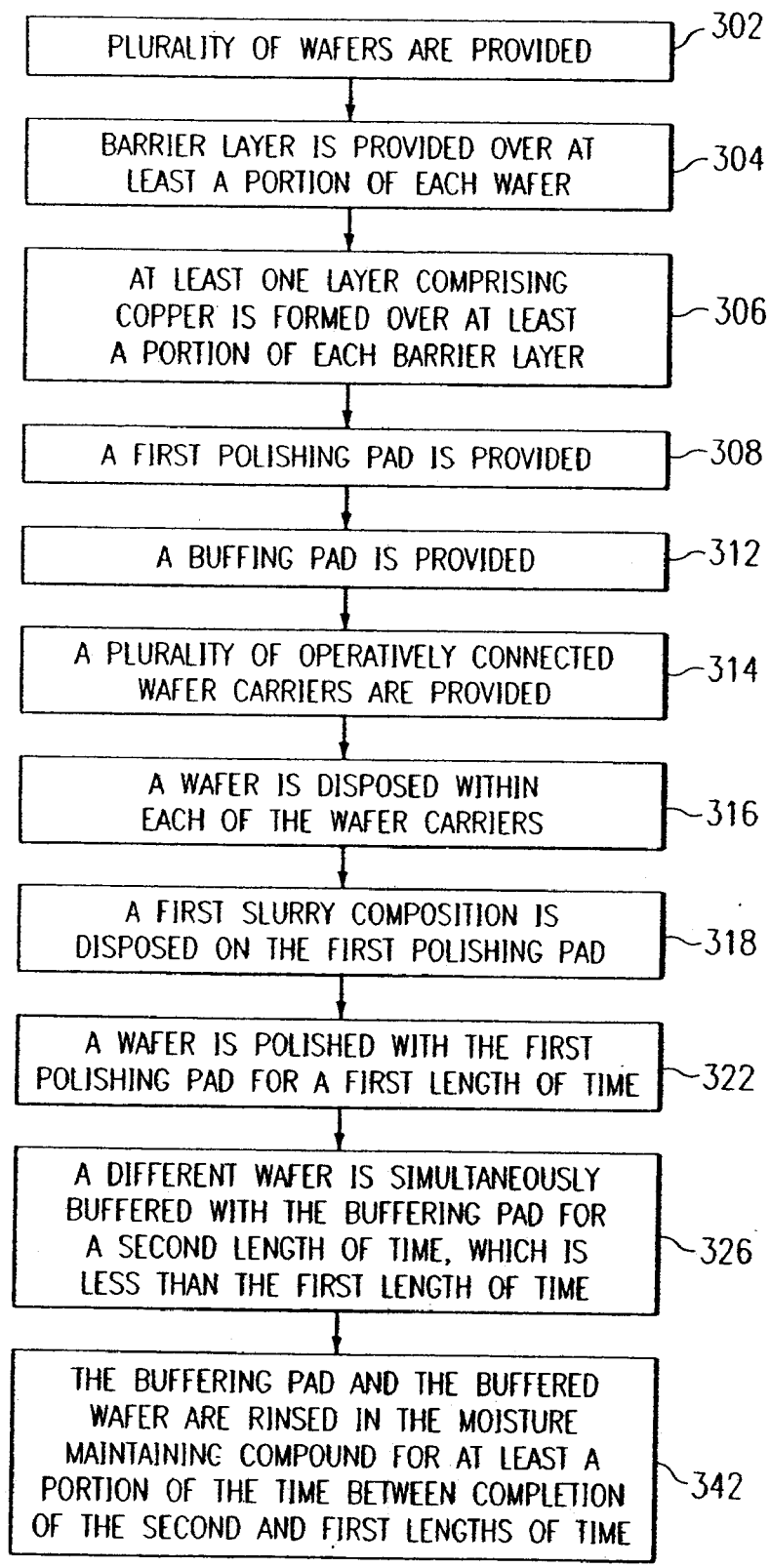

PROCESSES FOR CHEMICAL-MECHANICAL POLISHING OF A SEMICONDUCTOR WAFER

BACKGROUND OF THE INVENTION

1. Field of the Invention

The present invention relates generally to the field of chemical-mechanical polishing ("CMP") of a semiconductor wafer. Specifically, the present invention relates to processes for reducing defects on a semiconductor wafer.

2. Description of Related Art

Some known chemical-mechanical processes for polishing a semiconductor wafer may include forming a dielectric layer over the semi-conductor body, etching a plurality of trenches into the dielectric layer, and forming a barrier layer over the dielectric layer and the trenches. These known processes also include forming a copper seed level over the barrier layer and forming a copper level over the copper seed level, such that a portion of the copper seed layer and a portion of the copper level also are disposed in the trenches. In these known processes, the copper layer, the copper seed layer, and the barrier layer may be removed by a polishing pad, which may include a slurry composition disposed on the side of the polishing pad which contacts the various layers in order to oxidize the layers. Moreover, a first polishing pad may be used to remove the copper layer(s) and another polishing pad may be used to remove the barrier layer. After the removal of the copper layer(s) and the barrier layer, the wafer then may be transferred to a buffing pad, which may buff the wafer in order to buff out topographical defects. The pads may be periodically washed with de-ionized water. However, the polishing pads and the buffing pad may have defects on the side that polishes or buffs the wafer, which may be transferred to the wafer during the polishing and buffing steps. Moreover, in a polishing system, a number of wafers may be simultaneously polished, such that while the copper layer of one wafer is being removed, the barrier layer of the wafer which most recently underwent copper layer polishing may be simultaneously removed at another station. However, the barrier polishing step and the buffing step may take less time than the copper polishing step. As such, the polished wafer and the buffed wafer must wait until the completion of the copper polishing step before they may moved to the next station to perform the next step in the polishing processes. During this wait, the wafers on which operation has been completed are unable to move on to the next step and may begin to dry, which may allow the defects to permanently set into the wafer. Moreover, the de-ionized water which may be periodically applied to the pads may not prevent the defects from permanently setting in.

SUMMARY OF THE INVENTION

Therefore, a need has arisen for processes that overcome these and other shortcomings of the related art. A technical advantage of the present invention is that after the barrier level has been removed by the barrier level polishing pad, the polishing pad and wafer may be rinsed with a moisture maintaining compound, such as a copper chelating compound. The moisture maintaining compound may reduce or even prevent a drying of the wafer while the wafer is waiting to move on to the next step in the polishing process, which may improve wafer topography. Similarly, another technical advantage of the present invention is that after the wafer has been buffed, the buffing pad and the buffed wafer may be rinsed with the moisture maintaining compound, such as a copper chelating compound. The moisture maintaining compound may reduce or even prevent a drying of the wafer while the wafer is waiting to be unloaded from a wafer carrier, which may improve wafer topography.

In an embodiment of the present invention, a process for polishing a semiconductor wafer according to an embodiment of the present invention is described. The process comprises the steps of providing a plurality of wafers, forming a first layer, such as a barrier layer, over at least a portion of each wafer, and forming at least one layer comprising copper over at least a portion of each first layer. The process further includes the steps of providing a first polishing pad, providing a buffing pad, providing a plurality of operatively connected wafer carriers, and disposing a wafer within each of the wafer carriers. The process also includes the steps of disposing a first slurry composition on the first polishing pad, polishing a first of the wafers with said first polishing pad for a first length of time, in which the first polishing pad substantially removes the at least one layer comprising copper of the first wafer. The process further includes the steps of simultaneously buffing a second of the wafers with the buffing pad for a second length of time, in which the first length of time is greater than the second length of time, and rinsing the buffing pad and the second wafer with a moisture maintenance compound for at least a portion of the time between the completion of the second length of time and the first length of time. Moreover, the moisture maintenance compound substantially prevents a drying of the second wafer between the completion of the second length of time and the first length of time. In another embodiment, the moisture maintenance compound substantially cleans the second wafer between the completion of the second length of time and the first length of time.

In an embodiment of the present invention, a process for polishing a semiconductor wafer according to an embodiment of the present invention is described. The process comprises the steps of providing a plurality of wafers, forming a first layer, such as a barrier layer, over at least a portion of each wafer, and forming at least one layer comprising copper over at least a portion of each first layer. The process also comprises the steps of providing a first polishing pad, providing a second polishing pad, providing a buffing pad, providing a plurality of operatively connected wafer carriers, and disposing a wafer within each of the wafer carriers. The process further comprises the steps of disposing a first slurry composition on the first polishing pad, disposing a second slurry composition on the second polishing pad, and polishing a first of the wafers with the first polishing pad for a first length of time, in which the first polishing pad substantially removes the at least one layer comprising copper of the first wafer. The process also comprises the step of simultaneously polishing a second of the wafers with the second polishing pad for a second length of time, in which the second polishing pad substantially removes the first layer of the second wafer and the first length of time is greater than the second length of time.

The process further comprises the steps of simultaneously buffing a third of the wafers with the buffing pad for a third length of time, in which the first length of time is greater than the third length of time, and rinsing the second polishing pad and the second wafer with the moisture maintenance compound for at least a portion of the time between the completion of the second length of time and the first length of time. Moreover, the moisture maintenance compound substantially prevents drying of the second wafer between the completion of the second length of time and the first length of time. The process also comprises the step of rinsing the buffing pad and the third wafer with the moisture maintenance compound for at least a portion of the time between the completion of the third length of time and the first length of time. Moreover, the moisture maintenance compound substantially prevents drying of the third wafer between the completion of the third length of time and the first length of time. In another embodiment, the moisture maintenance compound substantially cleans the second wafer between the completion of the second length of time and the first length of time.

In yet another embodiment of the present invention, a process for polishing a semiconductor wafer according to an embodiment of the present invention is described. The process comprises the steps of providing a plurality of wafers, forming a first layer, such as a barrier layer, over at least a portion of each wafer, and forming at least one layer comprising copper over at least a portion of each first layer. The process further includes the steps of providing a first polishing pad, providing a plurality of operatively connected wafer carriers, and disposing a wafer within each of the wafer carriers. The process also includes the steps of disposing a first slurry composition on the first polishing pad, polishing a first of the wafers with said first polishing pad for a first length of time, in which the first polishing pad substantially removes the at least one layer comprising copper of the first wafer. The process further includes the steps of simultaneously unloading a second of the wafers from the wafer carrier for a second length of time, in which the first length of time is greater than the second length of time, and rinsing the second wafer with a moisture maintenance compound for at least a portion of the time between the completion of the second length of time and the first length of time. Moreover, the moisture maintenance compound substantially prevents a drying of the second wafer between the completion of the second length of time and the first length of time. In another embodiment, the moisture maintenance compound substantially cleans the second wafer between the completion of the second length of time and the first length of time.

Other features and advantages will be apparent to persons of ordinary skill in the art in view of the following detailed description of the invention and the accompanying drawings.

BRIEF DESCRIPTION OF THE DRAWINGS

For a more complete understanding of the present invention, needs satisfied thereby, and the features and advantages thereof, reference now is made to the following descriptions taken in connection with the accompanying drawings.

FIGS. 1a(1)–1a(5) are cross-sectional views depicting a system employing a process for polishing a semiconductor wafer according to a first embodiment of the present invention.

FIG. 1b(1)–1b(7) are cross-sectional views depicting a system employing a process for polishing a semiconductor wafer according to a second embodiment of the present invention.

FIG. 3a is a flow-chart of a process for polishing a semiconductor wafer according a fourth embodiment of the present invention.

DESCRIPTION OF PREFERRED EMBODIMENTS

Figure 2A:
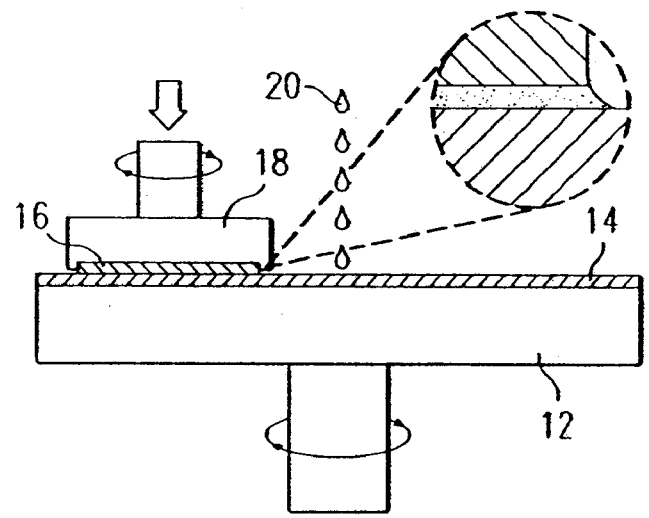
FIGS. 2a–2b are cross sectional views of a system employing a process for polishing a semiconductor wafer according to a third embodiment of the present invention.

Preferred embodiments of the present invention and their advantages may be understood by referring to FIGS. 1a(1)–1a(5), 1b(1)–1b(7), 2a–2c and 3a–3f, like numerals being used for like corresponding parts in the various drawings.

Referring to FIGS. 1a(1)–1a(5), 1b(1)–1b(7), 2a–2c, and 3a–3f, a process for polishing a semiconductor wafer according to several embodiments of the present invention is described. In step 302, a plurality of semiconductor wafers 102 are provided and in step 304 a first layer, such as a barrier layer 10, may be provided over at least a portion of each wafer 102. Barrier layer 110 may be disposed within a plurality of trenches 106 formed in a layer of each wafer 102. Step 102 also may include forming a second layer 104, such as a dielectric layer, over wafer 102, such that second layer 104 may be disposed between at least a portion of wafer 102 and at least a portion of barrier layer 110. In this embodiment, barrier layer 110 may be disposed within trenches 106 formed in the second layer 104. In step 306, at least one layer comprising copper may be formed over at least a portion of each barrier layer 110. For example, a copper layer 120 may be formed over at least a portion of barrier layer 110. Alternatively, a copper seed layer 112 may be formed over at least a portion of barrier layer 110 and copper layer 120 then may be formed over at least a portion of copper seed layer 112. In step 308, a first polishing pad 14a may be provided, and in step 312, a buffing pad 22 provided. In an alternative embodiment of the present invention, in step 308, first polishing pad 14a may be provided, and in step 310, a second polishing pad 14b may be provided. In yet another embodiment of the present invention, in step 310, first polishing pad 14a may be provided, in step 308, second polishing pad 14b may be provided, and in step 312, buffing pad 22 may be provided. Moreover, first polishing pad 14a, second polishing pod 14b, and buffing pad 22, each may be positioned on their own platen 12. Platen 12 may be stationary and also may be rotatable in a counter clockwise direction or a clockwise direction, or both, such that platen 12 may rotate but also may remain stationary with respect to a vertical axis. In addition, a rotation of platen 12 also may rotate the pad associated with the rotated platen 12.

Figure 2C:
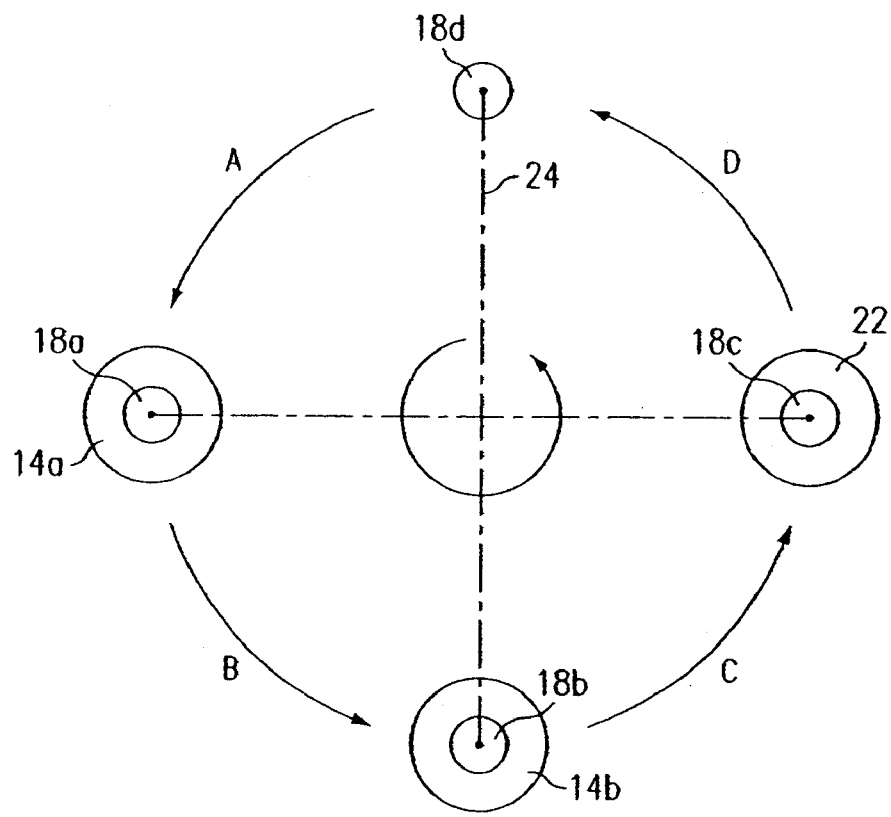
FIGS. 2c is an overhead view of a system employing a process for polishing a semiconductor wafer according to the third embodiment of the present invention.
Figure 2B:
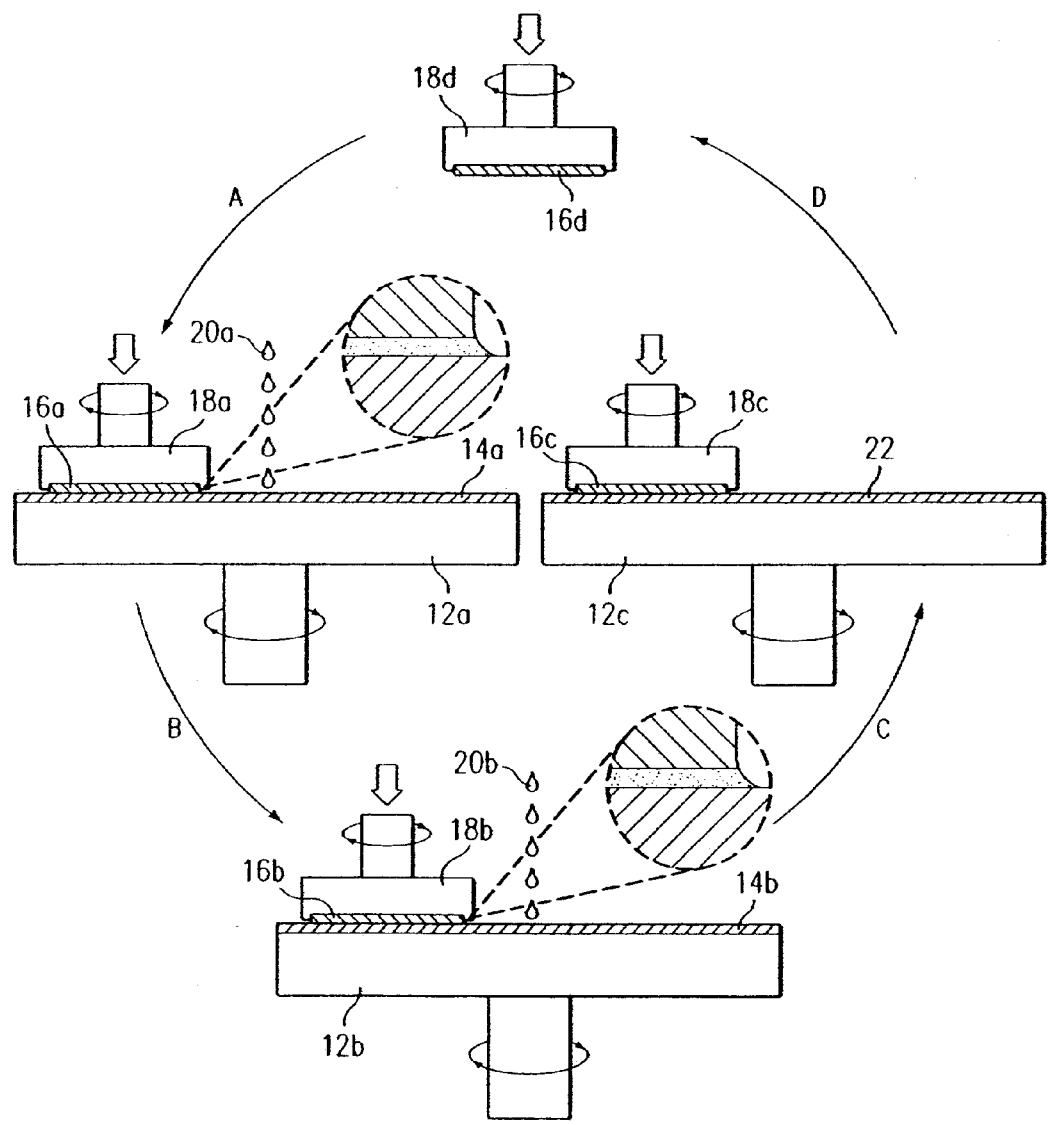
Figure 3B:
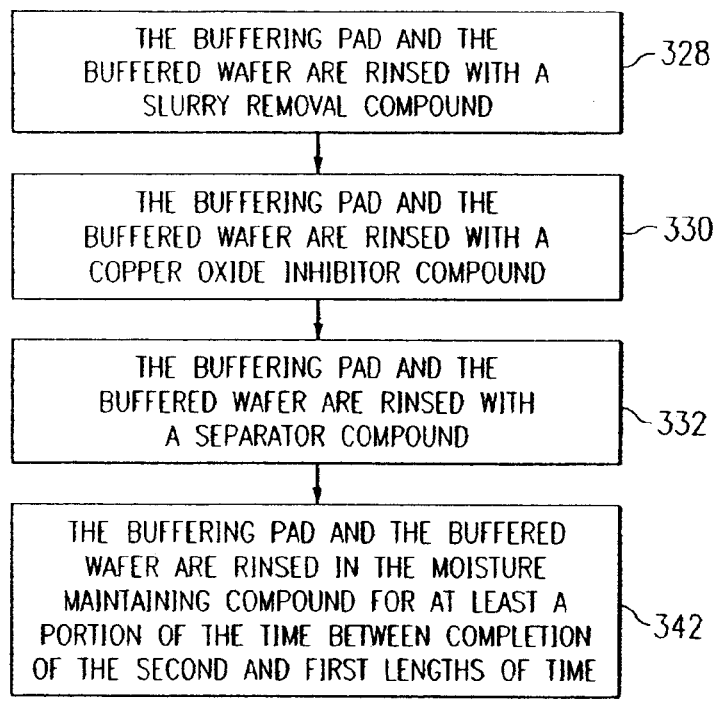
FIG. 3b is a flow-chart of a process for polishing a semiconductor wafer according a fifth embodiment of the present invention.
Figure 3D:
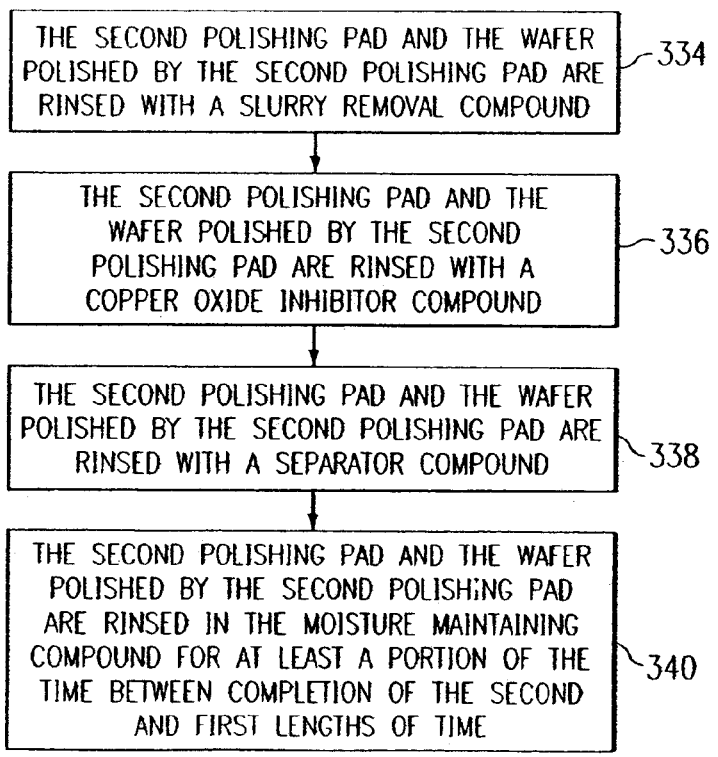
FIG. 3d is a flow-chart of a process for polishing a semiconductor wafer according a seventh embodiment of the present invention.
Figure 3C:
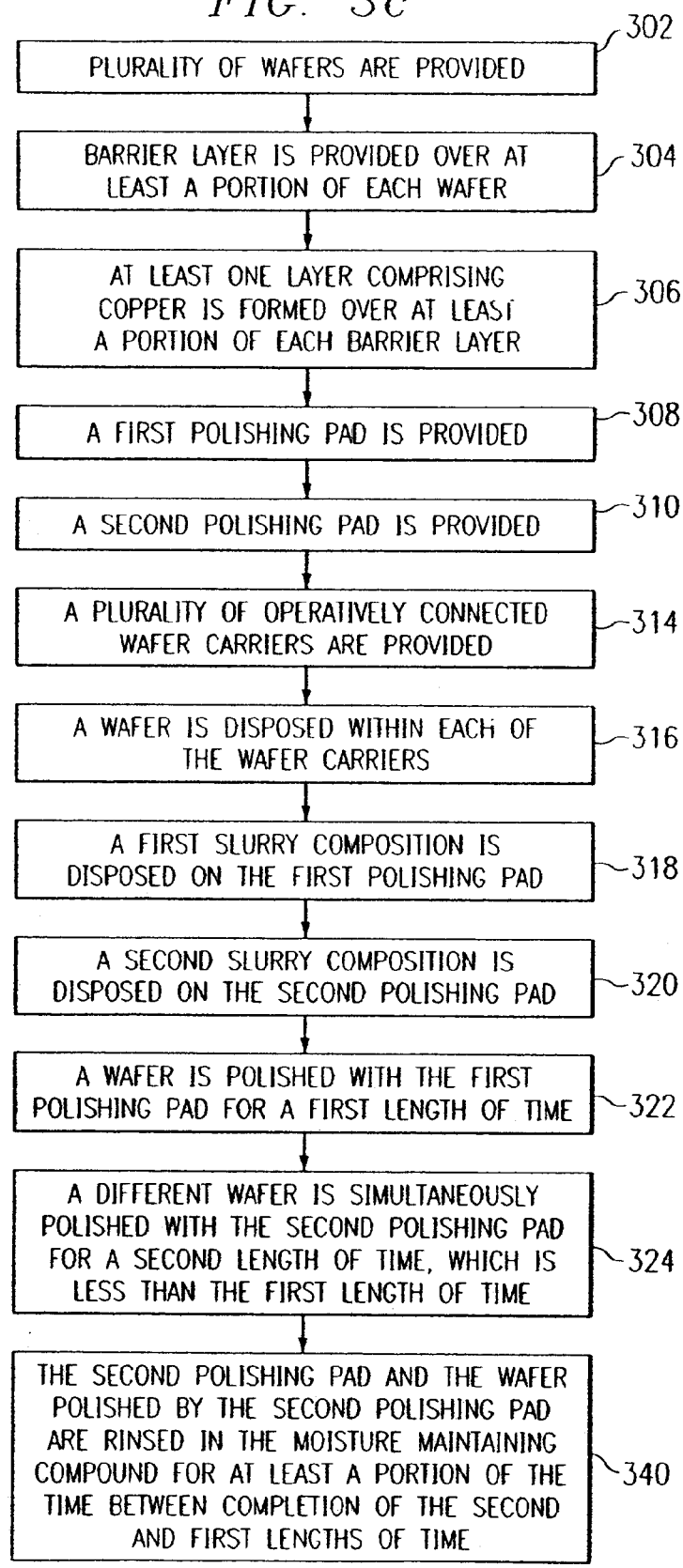
FIG. 3c is a flow-chart of a process for polishing a semiconductor wafer according a sixth embodiment of the present invention.
Figure 3E:
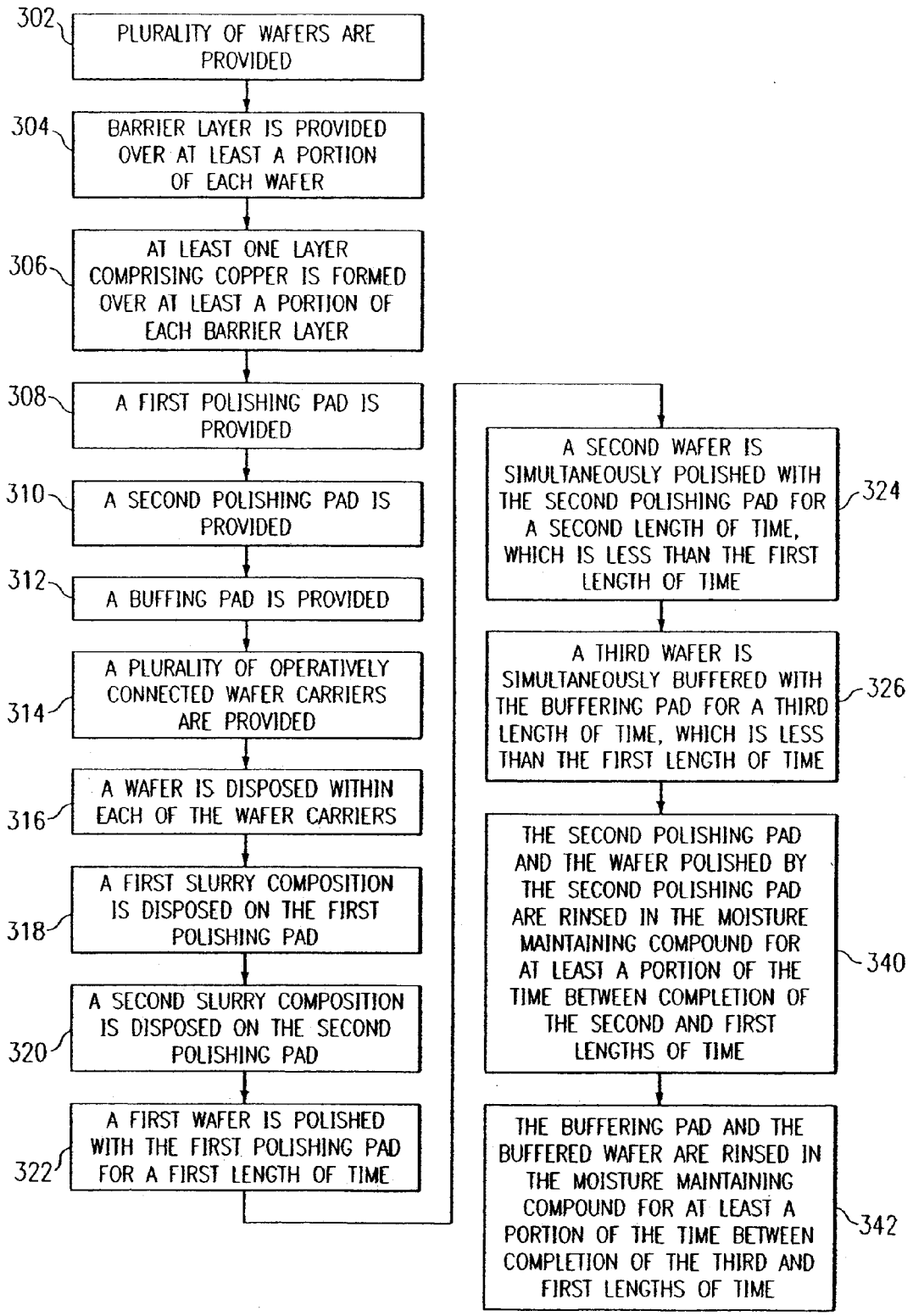
FIG. 3e is a flow-chart of a process for polishing a semiconductor wafer according a eighth embodiment of the present invention.
Figure 3F:
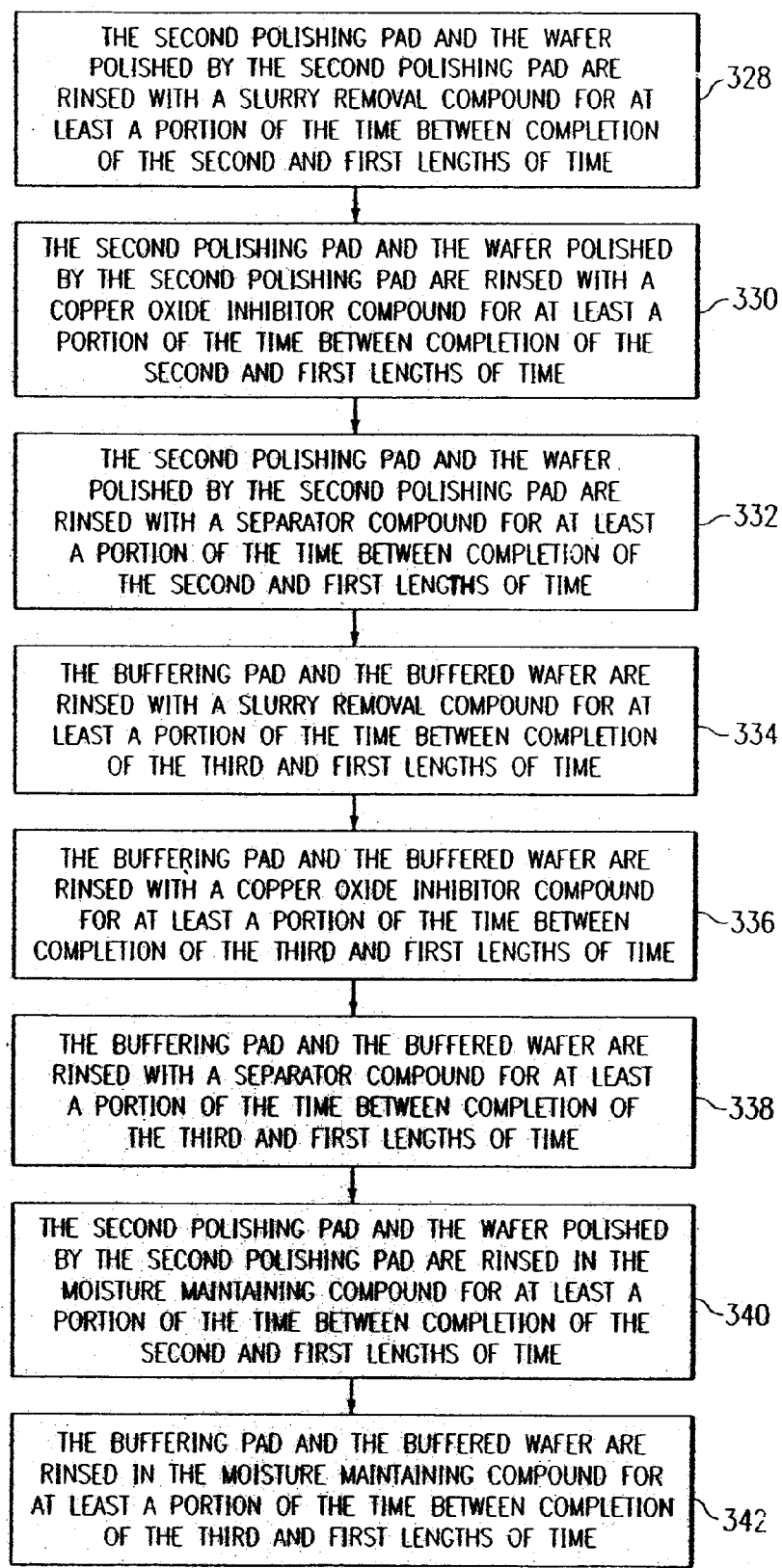
FIG. 3f is a flow-chart of a process for polishing a semiconductor wafer according a ninth embodiment of the present invention.

In each of the above described embodiments of the present invention, in step 314, a plurality of operatively coupled wafer carriers 18 may be provided. For example, as shown in FIG. 2c, wafer carriers 18 may be operatively coupled by a cross shaped connector apparatus 24, or the like. Moreover, connector apparatus 24 may be rotated along path A-B-C-D. Rotating connector apparatus 24 also may rotate wafer carriers 18 along path A-B-C-D, which may allow wafer carriers 18 to be positioned over each platen 12 at a different point in time. For example, a first wafer carrier 18a initially may be positioned over a first platen 12a, a second wafer carrier 18b initially may be positioned over a second platen 12b, a third wafer carrier 18c initially may be positioned over a third platen 12c, and a fourth wafer carrier 18d initially may not be positioned over any platen 12. When rotating connector apparatus 24 rotates wafer carriers 18, the position of wafer carriers 18 then may change. For example, alter rotation, first wafer carrier 18a may be positioned over second platen 12b, second wafer carrier 18b may be positioned over third platen 12c, third wafer carrier 18c may not be positioned over any platen 12, and fourth wafer carrier 18d may be positioned over first wafer. carrier 18a. This rotation process may continue until each wafer carrier 18 returns to its initial position, and the process then may be repeated.

In step 316, one wafer 102 may be disposed within each wafer carrer 18, and in step 318, a first slurry composition 20a may be disposed on first polishing pad 14a. First slurry composition 20a may be selected such that first slurry composition 20a may oxidize the at least one layer comprising copper. Oxidizing the copper layer may allow first polishing pad 14a to more readily remove or polish away the copper layer by mechanical abrasion. For example, first slurry composition 20a may comprise a known aluminum based composition, such as $Al_2O_3$ or the like. In step 322, a first of wafers 102 may be positioned over and in contact with first polishing pad 14a, such that the first of wafers 102 may be polished with first polishing pad 14a for a first length of time. The first length of time may be selected such that first polishing pad 14a may substantially remove the at least one layer comprising copper. In an alternative embodiment of the present invention, in step 318, first slurry composition 20a may be disposed on first polishing pad 14a, and in step 320, a second slurry composition 20b may be disposed on second slurry pad 14b. Second slurry composition 20b may be selected such that it may oxidize the barrier layer, and also may be selected such that it may not oxidize copper. For example, second slurry composition 20b may comprise a known silicon based composition, such as $SiO_2$ or the like. Alternatively, second slurry composition 20b may comprise an effective amount of a copper oxide inhibitor, such as between about 0.05% and about 0.3% of benzotriazole. Moreover, second slurry composition 20b may comprise both a known silicon based composition, such as $SiO_2$ or the like, and an effective amount of a copper oxide inhibitor, such as between about 0.05% and about 0.3% of benzotriazole. Then, in step 322, the first of wafers 102 may be positioned over and in contact with first polishing pad 14a, such that the first of wafers 102 may be polished with first polishing pad 14a for the first length of time.

In each of the above described embodiments of the present invention, in step 326, a different or second wafer 102 may be positioned over and in contact with buffing pad 22, such that the. second of wafers 102 may be buffed. with buffing pad 22 for a second length of time. The second length of time may be selected such that some, most, or all of the defects on the surface of the second of wafers 102 may be buffed out. Moreover, because the at least one layer comprising copper may have a substantial thickness, the first length of time may be greater than the second length of time. In an alternative embodiment of the present invention, step 326 may be replaced by step 324. In step 324, the different or second wafer 102 may be positioned over and in contact with second polishing pad 14b, such that barrier layer 110 of the second of wafers 102 may be polished with second polishing pad 14b for a second length of time. The second length of time may be selected such that barrier layer 110 may be substantially removed by second polishing pad 14b. Moreover, because the at least one layer comprising copper may be substantially thicker than barrier layer 110, the first length of time may be greater than the second length of time. In yet another embodiment of the present invention, the process may include both steps 324 and 326. In this embodiment, in step 324, the different or second wafer 102 may be positioned over and in contact with second polishing pad 14b, such that barrier layer 110 of the second of wafers 102 may be polished with second polishing pad 14b for a second length of time. Moreover, because the at least one layer comprising copper may be substantially thicker than barrier layer 110, the first length of time may be greater than the second length of time. In step 326, yet another or third wafer 102 may be positioned over and in contact with buffing pad 22, such that the third of wafers 102 may be buffed with buffing pad 22 for a third length of time. Moreover, because the at least one layer comprising copper may have a substantial thickness, the first length of time may be greater than the third length of time.

In each of the above described embodiments of the present invention, the process further may include step 342. In step 342, buffing pad 22 and buffed wafer 102 may be rinsed in a moisture maintenance compound, which substantially may prevent a drying of buffed wafer 102. The moisture maintenance compound also may substantially clean buffered wafer 102. Moreover, buffed wafer 102 may. be rinsed for at least a portion of the time between the completion of the second length of time and the first length of time, i.e., the time between the buffing of the buffed wafer 102 and the removal of the copper layer on the wafer 102 being polished by first polishing pad 14a. For example, the moisture maintenance compound may be copper chelating compound, which may comprise citric acid, or alternatively, may comprise ammonium citrate. The copper chelating compound also may comprise both citric acid and ammonium citrate. In any of these embodiments, the copper chelating compound further may comprise de-ionized water. In an alternative embodiment of the present invention, step 342 may be replaced by step 340. In step 340, second polishing pad 14b and the wafer 102 polished by second polishing pad 14b may be rinsed in the above-described moisture maintenance compound. Moreover, the wafer 102 polished by second polishing pad 14b may be rinsed for at least a portion of the time between the completion of the second length of time and the first length of time, i.e., the time between the polishing of the wafer 102 polished by second polisher 14b and the removal of the copper layer on the wafer 102 being polished by first polishing pad 14a.

In yet another embodiment of the present invention, the process may include both steps 340 and 342. In step 340, second polishing pad 14b and the wafer 102 polished by second polishing pad 14b may be rinsed in the above-described moisture maintenance compound. Moreover, the wafer 102 polished by second polishing pad 14b may be rinsed for at least a portion of the time between the completion of the second length of time and the first length of time, i.e., the time between the polishing of the wafer 102 polished by second polisher 14b and the removal of the copper layer on the wafer 102 being polished by first polishing pad 14a. Similarly, in step 342, buffing pad 22 and the buffed wafer 102 may be rinsed in the abovedescribed moisture maintenance compound. Moreover, buffed wafer 102 may be rinsed for at least a portion of the time between the completion of the third length of time and the first length of time, i.e., the time between the buffing of the buffed wafer 102 and the removal of the copper layer on the wafer 102 being polished by first polishing pad 14a.

In each of the above described embodiments of the present invention, the process further may include steps 328, 330, and 332. Moreover, like step 342, each of steps 328, 330, 332, also may occur during at least a portion of the time between the completion of the second length of time and the first length of time, i.e., the time between the buffing of the buffed wafer 102 and the removal of the copper layer on the wafer 102 being polished by first polishing pad 14a. In step 328, buffing pad 22 and the buffed wafer 102 may be rinsed with a residual slurry-removal compound. For example, the residual slurry-removal compound may comprise de-ionized water. In step 330, buffing pad 22 and the buffed wafer 102 may be rinsed with a copper oxide inhibitor compound. For example, the copper oxide inhibitor compound may comprise benzotriazole. In step 332, buffing pad 22 and the buffed wafer 102 may be rinsed with a separator compound. For example, the separator compound may comprise de-ionized water. In step 342, buffing pad 22 and the buffed wafer 102 may be rinsed in the above-described moisture maintenance compound. Moreover, the separator compound may substantially prevent a mixing of the moisture maintenance compound and the copper inhibitor compound.

In an alternative embodiment of the present invention, steps 328, 330, and 332 may be replaced with steps 334, 336, and 338, respectively, and step 342 may be replaced with step 340. Moreover, like step 340, each of steps 334, 336, 338, also may occur during at least a portion of the time between the completion of the second length of time and the first length of time, i.e., the time between the polishing of the wafer 102 polished by second polisher 14b and the removal of the copper layer on the wafer 102 being polished by first polishing pad 14a. In this embodiment, in step 334, second polishing pad 14b and the wafer 102 polished by second polishing pad 14b may be rinsed with the above-described residual slurry-removal compound. In step 336, second polishing pad 14b and the wafer 102 polished by second polishing pad 14b may be rinsed with the above-described copper oxide inhibitor compound. In step 332, second polishing pad 14b and the wafer 102 polished by second polishing pad 14b may be rinsed with the above-described separator compound. In step 340, second polishing pad 14b and the wafer 102 polished by second polishing.pad 14b may be rinsed in the above-described moisture maintenance compound. Moreover, the separator compound may substantially prevent a mixing of the moisture maintenance compound and the copper inhibitor compound.

According to yet another embodiment of the present invention, the process may include steps 328, 330, 332, 334, 336, 338, 340, and 342, such that buffing pad 22 and buffed wafer 102 may be rinsed in the above described compounds during at least a portion of the time between the completion of the buffing of the buffed wafer 102 and the removal of the copper layer on the wafer 102 being polished by first polishing pad 14a. Similarly, in this embodiment, second polishing pad 14b and the wafer 102 polished by second polishing pad 14b also may be rinsed in the above described compounds during at least a portion of the time between the completion of the polishing of the wafer 102 polished by second polisher 14b and the removal of the copper layer on the wafer 102 being polished by first polishing pad 14a.

In each of the above-described embodiments of the present invention, a fourth wafer 102 may be simultaneously unloaded from wafer carrier 118d, which may take a fourth length of time. The fourth wafer may be the wafer which already has been polished by first polishing pad 14a and second polishing pad 14b, and also has been buffered by buffering pad 22. In these embodiments, when wafer 102 is unloaded from wafer carrier 118d, fourth wafer 102 may be rinsed with the moisture maintenance compound for at least a portion of the time between the completion of said fourth length of time and the first length of time. Moreover, the moisture maintenance compound may substantially prevent drying of the fourth wafer between the completion of the fourth length of time and the first length of time.

While the invention has been described in connecting with preferred embodiments, it will be understood by those of ordinary skill in the art that other variations and modifications of the preferred embodiments described above may be made without departing from the scope of the invention. Other embodiments will be apparent to those of ordinary skill in the art from a consideration of the specification or practice of the invention disclosed herein.

What we claim is:

1. A process for polishing a semiconductor wafer, comprising the steps of:

providing a plurality of wafers;

forming a first layer over at least a portion of each wafer;

forming at least one layer comprising copper over at least a portion of each first layer;

providing a first polishing pad;

providing a buffing pad;

providing a plurality of operatively connected wafer carriers;

disposing a wafer within each of said wafer carriers;

disposing a first slurry composition on said first polishing pad;

polishing a first of said wafers with said first polishing pad for a first length of time, wherein said first polishing pad substantially removes said at least one layer comprising copper of said first wafer;

simultaneously buffing a second of said wafers with said buffing pad for a second length of time, wherein said first length of time is greater than said second length of time; and rinsing said buffing pad and said second wafer with a moisture maintenance compound for at least a portion of the time between the completion of said second length of time and said first length of time, said moisture maintenance compound substantially preventing drying of said second wafer between the completion of said second length of time and said first length of time.

2. The process of claim 1, wherein said moisture maintenance compound is a copper chelating compound and said moisture maintenance compound substantially cleans said second wafer between the completion of said second length of time and said first length of time.

3. The process of claim 2, wherein said copper chelating compound comprises at least one ingredient selected from the group consisting of citric acid and ammonium citrate.

4. The process of claim 1, wherein said copper chelating compound further comprises de-ionized water.

5. The process of claims 1, further comprising the steps of:

rinsing said buffing pad and said second wafer with a residual slurry removal compound for at least a portion of the time between the completion of said second length of time and said first length of time;

rinsing said buffing pad and said second wafer with a copper oxide inhibitor compound for at least a portion of the time between the completion of said second length of time and said first length of time; and rinsing said buffing pad and said second wafer with a separator compound for at least a portion of the time between the completion of said second length of time and said first length of time, wherein said separator compound substantially prevents a mixing of said moisture maintenance compound and said copper oxide inhibitor compound on said second wafer.

6. The process of claim 5, wherein said residual slurry removal compound comprises de-ionized water, said copper oxide inhibitor compound comprises benzotriazole, said separator compound comprises de-ionized water, said moisture maintenance compound is a copper chelating compound, and said moisture maintenance compound substantially cleans said second wafer between the completion of said second length of time and said first length of time.

7. The process of claim 6, wherein said copper chelating compound comprises at least one ingredient selected from the group consisting of citric acid and ammonium citrate.

8. The process of claim 7, wherein said copper chelating compound further comprises de-ionized water.

9. The process of claim 1, further comprising the steps of:

providing a second polishing pad;

disposing a second slurry composition on said second polishing pad;

simultaneously polishing a third of said wafers with said second polishing pad for a third length of time, wherein said second polishing pad substantially removes said first layer of said third wafer and said first length of time is greater than said third length of time; and rinsing said second polishing pad and said third wafer with said moisture maintenance compound for at least a portion of the time between the completion of said third length of time and said first length of time, said moisture maintenance compound substantially preventing drying of said third wafer between the completion of said, third length of time and said first length of time.

10. The process of claim 9, further comprising the steps of:

rinsing said second polishing pad and said third wafer with a residual slurry removal compound for at least a portion of the time between the completion of said third length of time and said first length of time;

rinsing said second polishing pad and said third wafer with a copper oxide inhibitor compound for at least a portion of the time between the completion of said third length of time and said first length of time; and rinsing said second polishing pad and said third wafer with a separator compound for at least a portion of the time between the completion of said third length of time and said first length of time,.wherein said separator compound substantially prevents a mixing of said moisture maintenance compound and said copper oxide inhibitor compound on said third wafer.

11. The process of claim 10, further comprising the steps of:

rinsing said buffing pad and said second wafer with said residual slurry removal compound for at least a portion of the time between the completion of said second length of time and said first length of time;

rinsing said buffing pad and said second wafer with copper oxide inhibitor compound for at least a portion of the time between the completion of said second length of time and said first length of time; and rinsing said buffing pad and said second wafer with said separator compound for at least a portion of the time between the completion of said second length of time and said first length of time, wherein said separator compound substantially prevents a mixing of said moisture maintenance compound and said copper oxide inhibitor compound on said second wafer.

12. The process of claim 11, wherein said residual slurry removal compound comprises de-ionized water, said copper oxide inhibitor compound comprises benzotriazole, said separator compound comprises de-ionized water, said moisture maintenance compound is a copper chelating compound, and said moisture maintenance compound substantially cleans said second wafer between the completion of said second length of time and said first length of time.

13. The process of claim 12, wherein said copper chelating compound comprises at least one ingredient selected from the group consisting of citric acid and ammonium citrate.

14. The process of claim 13, wherein said copper chelating compound further comprises de-ionized water.

15. A process for polishing a semiconductor wafer, comprising the steps of:

providing a plurality of wafers;

forming a first layer over at least a portion of each wafer;

forming at least one layer comprising copper over at least a portion of each first layer;

providing a first polishing pad;

providing a second polishing pad providing a buffing pad;

providing a plurality of operatively connected wafer carriers;

disposing a wafer within each of said wafer carriers;

disposing a first slurry composition on said first polishing pad;

disposing a second slurry composition on said second polishing pad;

polishing a first of said wafers with said first polishing pad for a first length of time, wherein said first polishing pad substantially removes said at least one layer comprising copper of said first wafer;

simultaneously polishing a second of said wafers with said second polishing pad for a second length of time, wherein said second polishing pad substantially removes said first layer of said second wafer and said first length of time is greater than said second length of time;

simultaneously buffing a third of said wafers with said buffing pad for a third length of time, wherein said first length of time is greater than said, third length of time;

rinsing said second polishing pad and said second wafer with a moisture maintenance compound for at least a portion of the time between the completion of said second length of time and said first length of time, said moisture maintenance compound substantially preventing drying of said second wafer between the completion of said second length of time and said first length of time; and rinsing said buffing pad and said third wafer with said moisture maintenance compound for at least a portion of the time between the completion of said third length of time and said first length of time, said moisture maintenance compound substantially preventing drying of said third wafer between the completion of said third length of time and said first length of time.

16. The process of claim 15, further comprising the steps of:
rinsing said second polishing pad and said second wafer with a residual slurry removal compound for at least a portion of the time between the completion of said second length of time and said first length of time;
rinsing said second polishing pad and said second wafer with a copper oxide inhibitor compound for at least a portion of the time between the completion of said second length of time and said first length of time; and
rinsing said second polishing pad and said second wafer with a separator compound for at least a portion of the time between the completion of said second length of time and said first length of time, wherein said separator compound substantially prevents a mixing of said moisture maintenance compound and said copper oxide inhibitor compound on said second wafer.

17. The process of claim 10, further comprising the steps of:
rinsing said buffing pad and said third wafer with said residual slurry removal compound for at least a portion of the time between the completion of said third length of time and said first length of time;
rinsing said buffing pad and said third wafer with said copper oxide inhibitor compound for at least a portion of the time between the completion of said third length of time and said first length of time; and
rinsing said buffing pad and said third wafer with said separator compound for at least a portion of the time between the completion of said third length of time and said first length of time, wherein said separator compound substantially prevents a mixing of said moisture maintenance compound and said copper oxide inhibitor compound on said third wafer.

18. The process of claim 17, wherein said residual slurry removal compound comprises de-ionized water, said copper oxide inhibitor compound comprises benzotriazole, said separator compound comprises de-ionized water, said moisture maintenance compound is a copper chelating compound, and said moisture maintenance compound substantially cleans said second wafer between the completion of said second length of time and said first length of time.

19. The process of claim 18, wherein said copper chelating compound comprises at least one ingredient selected from the group consisting of citric acid and ammonium citrate.

20. A process for polishing a semiconductor wafer, comprising the steps of:
providing a plurality of wafers;
forming a first layer over at least a portion of each wafer;
forming at least one layer comprising copper over at least a portion of each first layer;
providing a first polishing pad;
providing a plurality of operatively connected wafer carriers;
disposing a wafer within each of said wafer carriers;
disposing a first slurry composition on said first polishing pad;
polishing a first of said wafers with said first polishing pad for a first length of time, wherein said first polishing pad substantially removes said at least one layer comprising copper of said first wafer;
simultaneously unloading a second of said wafers from said wafer carrier for a second length of time, wherein said first length of time is greater than said second length of time; and
rinsing said second wafer with a moisture maintenance compound for at least a portion of the time between the completion of said second length of time and said first length of time, said moisture maintenance compound substantially preventing drying of said second wafer between the completion of said second length of time and said first length of time.

* * * * *